United States Patent
Takahashi et al.

(10) Patent No.: US 9,184,718 B2
(45) Date of Patent: Nov. 10, 2015

(54) GAIN CONTROL CIRCUIT, COMMUNICATION DEVICE, ELECTRONIC APPLIANCE, AND GAIN CONTROL METHOD

(75) Inventors: Katsuaki Takahashi, Kanagawa (JP); Naoto Yoshikawa, Tokyo (JP)

(73) Assignee: Sony Corporation, Tokyo (JP)

( * ) Notice: Subject to any disclaimer, the term of this patent is extended or adjusted under 35 U.S.C. 154(b) by 44 days.

(21) Appl. No.: 14/002,907

(22) PCT Filed: Mar. 7, 2012

(86) PCT No.: PCT/JP2012/055862
§ 371 (c)(1),
(2), (4) Date: Sep. 3, 2013

(87) PCT Pub. No.: WO2012/124576
PCT Pub. Date: Sep. 20, 2012

(65) Prior Publication Data
US 2013/0335146 A1    Dec. 19, 2013

(30) Foreign Application Priority Data

Mar. 16, 2011 (JP) ................ 2011-057725

(51) Int. Cl.
*H04B 1/06* (2006.01)
*H04B 7/00* (2006.01)
*H03G 3/30* (2006.01)

(52) U.S. Cl.
CPC ........... *H03G 3/3042* (2013.01); *H03G 3/3052* (2013.01); *H03G 3/3068* (2013.01)

(58) Field of Classification Search
CPC ......... H03G 3/3026; H03G 5/16; H03G 3/20; H03G 3/30; H04B 1/10; H04B 2001/0416; H04B 17/0057; H04B 17/0067; H04B 1/1027; H04B 1/18

USPC ........... 455/232.1, 234.1–235.1, 245.1–251.1
See application file for complete search history.

(56) References Cited

U.S. PATENT DOCUMENTS 5,276,406 A * 1/1994 Samay et al. .................. 330/277
5,404,585 A * 4/1995 Vimpari et al. ............. 455/115.1
(Continued)

FOREIGN PATENT DOCUMENTS

| JP | 09-326718 A | 12/1997 |
|---|---|---|
| JP | 2000-040929 A | 2/2000 |
| JP | 2000-244353 A | 9/2000 |

OTHER PUBLICATIONS

International Search Report issued May 15, 2012 in PCT/JP2012/055862.

*Primary Examiner* — Pablo Tran
(74) *Attorney, Agent, or Firm* — Sony Corporation

(57) ABSTRACT

The present technology relates to a gain control circuit, a communication device, an electronic appliance, and a gain control method which aim to provide a technology capable of suppressing intermodulation distortion. The gain control circuit includes a first amplifier for amplifying an input signal, and a signal determination unit for determining an input signal to be input to the first amplifier, and controlling an amplification factor of the first amplifier based on the determination result. The communication device includes a first amplifier for amplifying a received signal, a receiving unit for performing a receiving process based on a signal output from the first amplifier, and a signal determination unit for determining a received signal to be input to the first amplifier, and controlling the amplification factor of the first amplifier based on the determination result. In the gain control method, an input signal to be input to a first amplifier for amplifying an input signal is determined, and the amplification factor of the first amplifier is controlled by a feed forward system based on the determination result.

16 Claims, 8 Drawing Sheets

(56) References Cited

U.S. PATENT DOCUMENTS

| | | | |
|---|---|---|---|
| 6,137,993 A * | 10/2000 | Almgren et al. | 455/67.13 |
| 6,181,731 B1 * | 1/2001 | Kochi et al. | 375/144 |
| 6,219,376 B1 * | 4/2001 | Zhodzishsky et al. | 375/148 |
| 7,948,528 B2 * | 5/2011 | Takahashi et al. | 348/223.1 |
| 8,649,738 B2 * | 2/2014 | Takahashi et al. | 455/73 |
| 2010/0309774 A1 * | 12/2010 | Astrom | 370/201 |
| 2011/0069738 A1 * | 3/2011 | Sugino et al. | 375/130 |
| 2014/0050328 A1 * | 2/2014 | Fischer | 381/60 |
| 2014/0171062 A1 * | 6/2014 | Fallgren et al. | 455/422.1 |

* cited by examiner

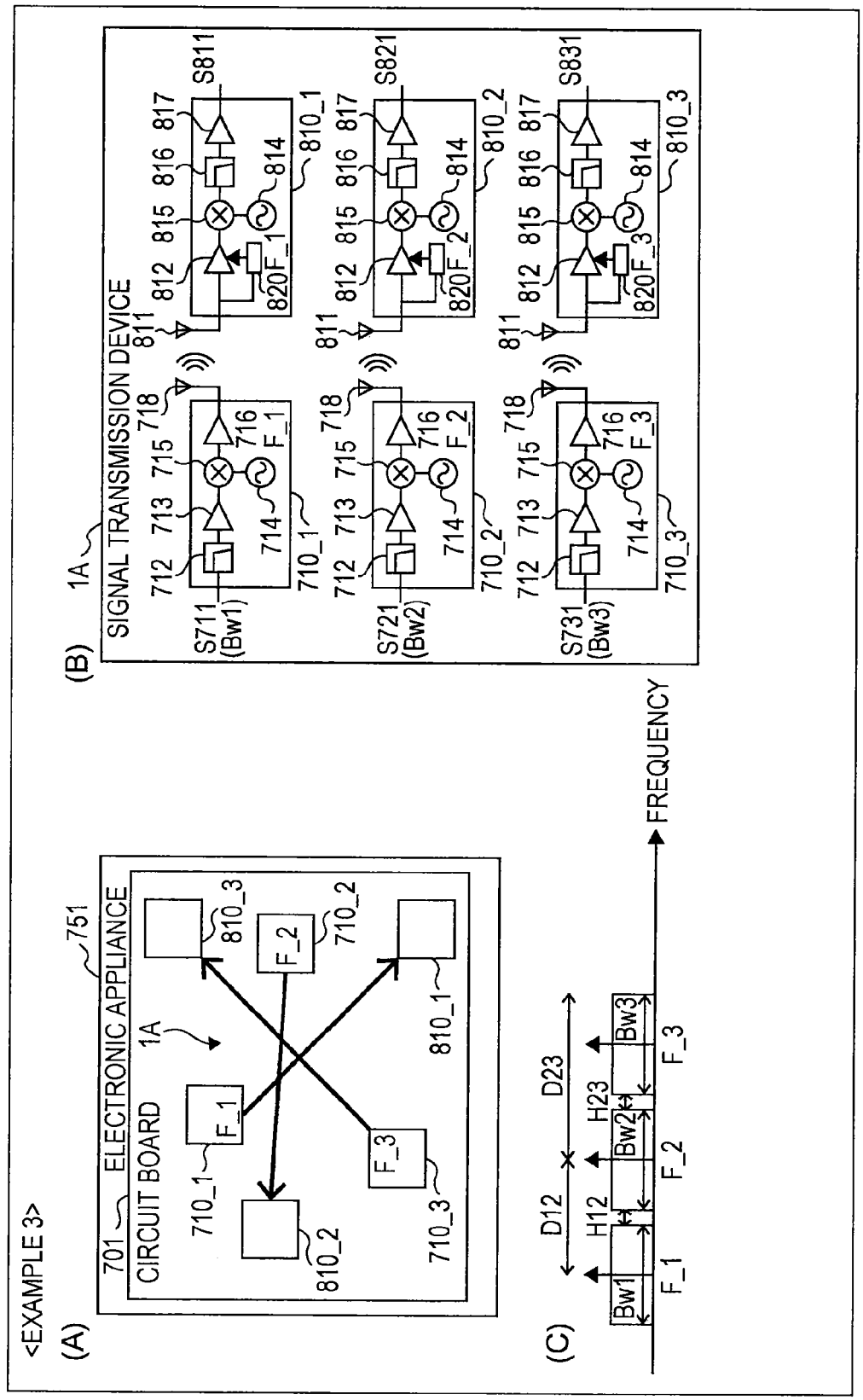

GAIN CONTROL CIRCUIT, COMMUNICATION DEVICE, ELECTRONIC APPLIANCE, AND GAIN CONTROL METHOD

TECHNICAL FIELD

The technology disclosed in the present specification relates to a gain control circuit, a communication device, an electronic appliance, and a gain control method.

BACKGROUND ART

In an electronic circuit, in a case a plurality of signals at different frequencies are input, so-called intermodulation distortion arises a problem. For example, a case of an amplifier circuit provided at an input stage of a receiving circuit is typical. For example, in a case the difference of two carrier frequencies is present near the frequency of a desired wave, there is a problem of "intermodulation distortion" where an interfering component is also demodulated. Typically, when signals at a plurality of frequencies adjacent to the receiving band of a self station are received, if the linear performance of an amplifier circuit or a frequency mixer circuit is poor, third-order distortion is caused within the receiving band (normally, only a first-order component of a modulated signal has to be taken into account), and the reception quality is significantly reduced.

As a method of preventing the problem of "intermodulation distortion", there is known a method of adding a wavelength selective bandpass filter to an input unit of a receiving circuit, for example. However, this method increases the cost regarding the bandpass filter, or increases the size of the substrate, for example. Also, since generally the bandpass filter acts only with respect to a fixed frequency, using the same while making the corresponding frequency variable is difficult, and the bandpass filter has to be prepared for each communication channel (in other words, a carrier frequency; hereinafter also referred to as a "band").

As another method of preventing the problem of intermodulation distortion, there is also known a method of improving "non-linear operation of a circuit member" which is the cause of occurrence in the first place. This is a method where a circuit member is not added. For example, to improve the linear performance of a circuit, a measure of increasing the bias current or optimizing the DC bias point such that operation is in a linear region as much as possible is effective, but this increases the power supply voltage or increases the consumption power. Or, it is also conceivable to use an expensive circuit member with improved linearity, but even if an expensive circuit member is used, the non-linearity cannot, in principle, be made zero.

In contrast, for example, Japanese Patent Application Laid-Open No. 2000-244353 proposes a technology which assumes that occurrence of intermodulation distortion is inevitable, and which includes a gain control circuit (a variable gain amplifier circuit) at an input stage to restrict the gain at the time of large input such that the intermodulation distortion may be suppressed in a use state, to thereby suppress distortion at the gain control circuit or at a frequency conversion circuit (a mixer circuit, a mixer) at a later stage.

However, the technology proposed in Japanese Patent Application Laid-Open No. 2000-244353 includes two stages of gain control circuits in a system for input signals, and includes a level detection circuit (a wave detector) for each gain control circuit, and thus, the circuit is complicated.

CITATION LIST

Patent Document

Patent Document 1: Japanese Patent Application Laid-Open No. 2000-244353

SUMMARY OF THE INVENTION

Problems to be Solved by the Invention

In the present technical field, another technology capable of suppressing the intermodulation distortion is desired.

The present disclosure aims to provide a technology capable of suppressing the intermodulation distortion.

Solutions to Problems

A gain control circuit according to a first aspect of the present disclosure includes a first amplifier for amplifying an input signal and a signal determination unit for determining the input signal to be input to the first amplifier, and controlling an amplification factor of the first amplifier based on a determination result. Each gain control circuit described in a dependent claim for the gain control circuit according to the first aspect of the present disclosure defines another advantageous concrete example of the gain control circuit according to the first aspect of the present disclosure.

A communication device according to a second aspect of the present disclosure includes a first amplifier for amplifying a received signal, a receiving unit for performing a receiving process based on a signal output from the first amplifier, and a signal determination unit for determining the received signal to be input to the first amplifier, and controlling an amplification factor of the first amplifier based on a determination result. The same technologies and methods described in the dependent claims for the gain control circuit according to the first aspect may be applied to the communication device according to the second aspect of the present disclosure, and structures where these are applied define other advantageous concrete examples of the communication device according to the second aspect.

An electronic appliance according to a third aspect of the present disclosure includes a first amplifier for amplifying an input signal, a signal processing unit for performing signal processing based on a signal output from the first amplifier, and a signal determination unit for determining the input signal to be input to the first amplifier, and controlling an amplification factor of the first amplifier based on a determination result. The same technologies and methods described in the dependent claims for the gain control circuit according to the first aspect may be applied to the electronic appliance according to the third aspect of the present disclosure, and structures where these are applied define other advantageous concrete examples of the electronic appliance according to the third aspect.

An electronic appliance according to a fourth aspect of the present disclosure includes a first amplifier for amplifying a received signal, a receiving unit for performing a receiving process based on a signal output from the first amplifier, and a signal determination unit for determining the received signal to be input to the first amplifier, and controlling an amplification factor of the first amplifier based on a determination result. The same technologies and methods described in the dependent claims for the gain control circuit according to the first aspect may be applied to the electronic appliance according to the fourth aspect of the present disclosure, and structures where these are applied define other advantageous concrete examples of the electronic appliance according to the fourth aspect.

In a gain control method according to a fifth aspect of the present disclosure, the input signal includes a desired wave and an interfering wave, and the amplification factor of the first amplifier is controlled with a fixed difference in levels of the desired wave and the interfering wave. The same technologies and methods described in the dependent claims for the gain control circuit according to the first aspect may be applied to the gain control method according to the fifth aspect of the present disclosure, and structures where these are applied define other advantageous concrete examples of the gain control method according to the fifth aspect.

In short, the technology of the present disclosure controls the amplification factor of a first amplifier by a feed forward system. There is no need to provide two stages of gain control circuits in a system for input signals as with the technology proposed in Japanese Patent Application Laid-Open No. 2000-244353.

Effects of the Invention

According to the gain control circuit, the communication device, the electronic appliance, and the gain control method of the present disclosure, since the amplification factor of a first amplifier is controlled by feed forward, a gain control method different from the technology proposed in Japanese Patent Application Laid-Open No. 2000-244353 may be realized.

BRIEF DESCRIPTION OF DRAWINGS

FIGS. 12(A) to 12(C) are diagrams for describing Example 3.

MODE FOR CARRYING OUT THE INVENTION

Figure 1:
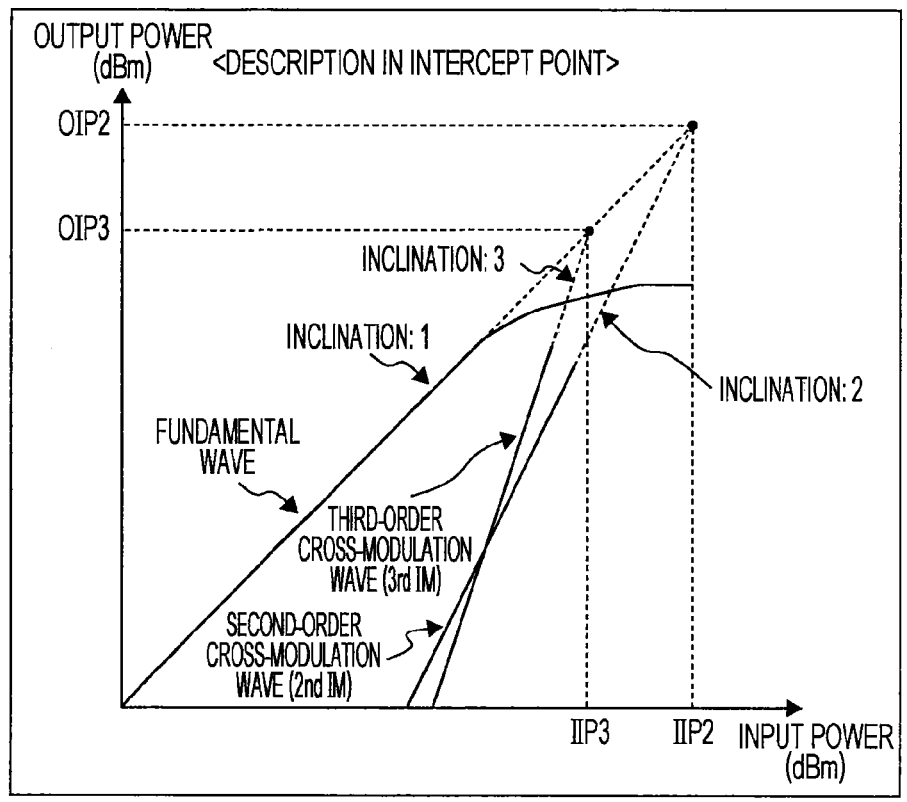
FIG. 1 is a diagram for describing cross modulation distortion.

Hereinafter, embodiments of the technology disclosed in the present specification will be described in detail with reference to the drawings. If each functional element is to be distinguished between modes, an alphabet or "n" (n is a number) or a combination of these signs are attached, and if distinction is not particularly necessary, the sign(s) is omitted. The same can be said for the drawings.

The description will be given in the following order.
1. General Outline
2. Cross Modulation Distortion
3. Basic Structure
4. Modified Structure 1
5. Modified Structure 2
6. Concrete Example Application
Example 1: Corresponding to Basic Structure
Example 2: Modified Structure 1
Example 3: Application to Communication Device, Electronic Appliance <General Outline>

First, basic matters will be described below.

In a structure of the present embodiment, a gain control circuit, a communication device, and an electronic appliance include a first amplifier for amplifying an input signal (for example, a received signal), and a signal determination unit for determining an input signal to be input to the first amplifier and controlling the amplification factor of the first amplifier based on the determination result. The gain control system for the first amplifier is realized by feed forward. Accordingly, basically, there is no need to provide two stages of gain control circuits to the system for input signals. Moreover, as a whole, the circuit will be simpler. In the case of an electronic appliance, there may be a plurality of communication units including the first amplifier, the receiving unit, and the signal determination unit.

For example, in a case an input signal (for example, a received signal) includes a desired wave and an interfering wave, the signal determination unit determines each of the levels of the desired wave and the interfering wave.

At this time, as a first method, the signal processing unit may determine the level of the desired wave and the level of the interfering wave without distinguishing the two. If the level of the desired wave is greater, control is performed based on the absolute value of the level of the desired wave, and if the level of the interfering wave is greater, control is performed based on the absolute value of the level of the interfering wave.

In the case of applying the first method, the signal determination unit preferably includes a second amplifier for amplifying an input signal to be input to the first amplifier, and a level detection unit for detecting the level of an output signal of the second amplifier. In this case, the level detection unit controls the first amplifier with a relative relationship between the amplification factor of the first amplifier and the amplification factor of the second amplifier.

In this case, the amplification factor of the first amplifier and the amplification factor of the second amplifier are preferably controlled to be the same. An additional circuit for offset adjustment or the like will be unnecessary.

Also, in this case, the second amplifier is preferably proportionally smaller in size than the first amplifier. The first amplifier preferably has a good noise characteristic, but this is not necessary for the second amplifier, because it is enough if the level of the desired wave and the level of the interfering wave can be distinguished from each other.

As a second method, the signal determination unit preferably includes a first level detection unit for detecting the level of a desired wave, a second level detection unit for detecting the level of an interfering wave, and a level determination unit for controlling the amplification factor of the first amplifier based on the detection results of the first level detection unit and the second detection unit. That is, this is a structure where determination is performed while distinguishing between the level of the desired wave and the level of the interfering wave.

With either of the first method and the second method, the amplification factor of the first amplifier is preferably controlled with a fixed difference in the levels of the desired wave and the interfering wave.

In the structure of the present embodiment, the gain control circuit, the communication device, and the electronic appliance may be provided, for the output of the first amplifier, with a bandwidth limitation unit for limiting the bandwidth of an output signal to the bandwidth of a desired wave. This is because, since the gain control system for the first amplifier is realized by feed forward, the influence of bandwidth limitation for the output of the first amplifier is not felt.

In the structure of the present embodiment, the gain control circuit, the communication device, and the electronic appliance may be provided, at a later stage of the first amplifier, with a feedback control loop for detecting the level of a signal corresponding to the level of an output signal of the first amplifier and controlling the amplification factor of the first amplifier. This is because a gain control loop is preferably provided for when an input signal is small. This control loop preferably uses negative feedback, but is not necessarily limited to negative feedback.

<Cross Modulation Distortion>

Before describing the basic structure, example modifications and examples to be described later, cross modulation distortion, which is an important evaluation factor, will be first described. FIG. 1 is a diagram for describing the cross modulation distortion.

In the case of evaluating the characteristics of an amplifier circuit, not only AC characteristics (bandwidth, slew rate, settling time, etc.), but also item such as harmonic distortion, spurious free dynamic range (SFDR) intermodulation distortion (IMD), intercept point (IP, IP2, IP3, etc.), noise (S/N: Signal to Noise Ratio), noise figure (NF) and the like are included, for example.

For example, in a case a sine wave of a purely single frequency passes through an amplifier circuit (the same applies for other active elements), harmonic distortion is caused according to the characteristics and the non-linearity. Merely measuring the harmonic distortion while changing the frequency of the sine wave is not enough to evaluate the true performance of an amplifier circuit that is to be used for a case where signals at different frequencies are to be input (for example, communication use). In many communication uses, a large number of channels that are multiplexed in a frequency domain are used, and thus, the amplifier circuit has to be evaluated using the amount of intermodulation distortion at two or more specified frequencies.

When studying the occurrence of distortion due to two signals (referred to as a two-tone signal), it can be seen that second-order and third-order intermodulation products are caused. FIG. 1 shows this state, and the state is shown focusing on the second-order and third-order intermodulation products occurring when two signals whose frequencies are f1 and f2 are added to a non-linear element. Generally, the second-order intermodulation distortion is specified using the value of IP2, and the third-order intermodulation distortion is specified using the value of IP3. Additionally, a number read on the input level side is expressed by IIP, and a number read on the output level side is expressed by OIP, and degrees (multipliers) are further applied thereto to be expressed by IIP2, IIP3, OIP2, OIP3, and the like.

This is an evaluation result in a state where two sine waves at close frequencies (two-tone signal) are simultaneously applied to a receiving circuit. In addition to single tone output signal power (dBm), relative values (relative to the single tone) of the second-order intermodulation distortion and the third-order intermodulation distortion are plotted as functions of input signal power. A function of a fundamental wave is expressed by a curve of inclination 1. If the non-linearity of the circuit is approximated by power series expansion, the amplitude of the second-order intermodulation distortion is increased by 2 dB every time signal input is increased by 1 dB, and this is shown in the drawing as a curve of inclination 2. In the same manner, the amplitude of the third-order intermodulation distortion is increased by 3 dB every time an input signal is increased by 1 dB, and this is shown as a curve of inclination 3. Additionally, in reality, when an input signal exceeds a specific level, the increase in an output signal starts to be clipped (peaked). That is, in a domain where a straight line of ideal inclination 1 is shown by a dotted line, output is actually compressed in the manner shown by a solid line.

Here, if the straight lines of the second-order and the third-order intermodulation distortions are extended, these intersect with an extended portion of a line showing an ideal output response. These are second-order and third-order intercept points (IP2, IP3). Additionally, these show the output power that the circuit supplies to matched load (for example, 50Ω) in dBm.

<Basic Structure>

Figure 2:
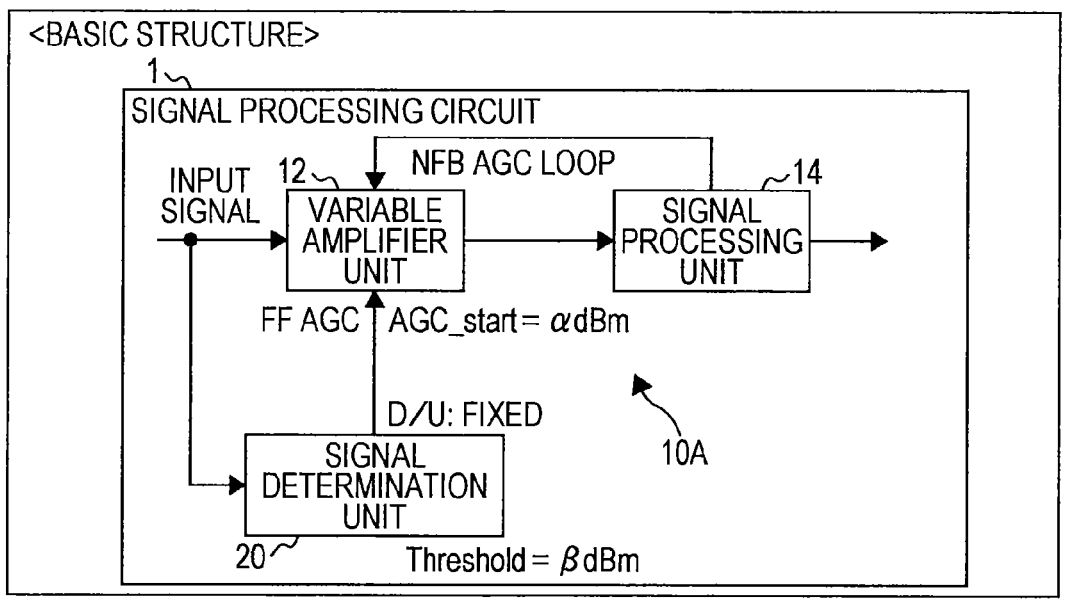
FIG. 2 is a diagram for describing a basic structure of a gain control circuit of a present embodiment.

FIG. 2 is a diagram for describing a basic structure of a gain control circuit of the present embodiment. A gain control circuit 10A is embedded in a signal processing circuit 1, and includes a variable amplifier unit 12, a signal processing unit 14 having a level detection function, and a signal determination unit 20.

The variable amplifier unit 12 is provided on a main signal path, and its output signal is input to the signal processing unit 14, and predetermined signal processing is performed at the signal processing unit 14. Accordingly, as the variable amplifier unit 12, a low noise amplifier with a good noise characteristic (and, generally, a large size) is used. For example, in a case the signal processing unit 14 is for performing a receiving process, it is provided with a demodulation circuit. In order to perform required signal processing, the signal processing unit 14 detects the input level (the output level of the variable amplifier unit 12) or the signal level of a predetermined function unit inside the signal processing unit 14 corresponding to the input level, and supplies the detection result to the variable amplifier unit 12. Thus, with respect to the main signal path, when the input level of the variable amplifier unit 12 is lower than a predetermined level, an automatic gain control (AGC) function is made to act between the variable amplifier unit 12 and the signal processing unit 14 based on a feedback loop (NFB) so that the input level of the signal processing unit 14 will be constant. Additionally, the gain control function regarding the main signal path for causing the input level of the signal processing unit 14 to be constant when the input level of the variable amplifier unit 12 is low does not have to be based on the feedback loop, and any other circuit structures may be applied.

The signal determination unit 20 is provided on a signal path (referred to as a replica signal path) different from the main signal path, and determines the state of a signal to be input to the variable amplifier unit 12, and when the input level of the variable amplifier unit 12 is higher than a predetermined level, the automatic gain control function acts on the variable amplifier unit 12 based on feed forward (FF) so that the input level of the signal processing unit 14 will be constant.

Now, the start point (AGC_start) of AGC of the feed forward system by the signal determination unit 20 and the variable amplifier unit 12 is given as α dBm. A threshold (Threshold) of the signal determination unit 20 is given as β dBm.

As a desired signal becomes larger, the gain of the variable amplifier unit 12 is reduced according to the determination output of the signal determination unit 20. In the case of low signal input, the gain of the variable amplifier unit 12 is maximized and the deterioration of NF (noise factor) is prevented, and in contrast, in the case of large input, the gain is restricted to suppress the distortion at the variable amplifier unit 12 and the signal processing unit 14, and the signal transmission device 1 (for example, a receiving circuit) with a wide dynamic range is structured.

With the gain control circuit 10A structured in this manner, if an input signal is smaller than a predetermined level, the input level of the signal processing unit 14 is prevented from being lowered by an amplification function of the variable amplifier unit 12. On the other hand, if an input signal is greater than a predetermined level, the input level of the signal processing unit 14 is prevented from becoming excessively large by an attenuation function of the variable amplifier unit 12 in response to the determination result of the signal determination unit 20, and distortion at the variable amplifier unit 12 and the signal processing unit 14 may be suppressed. For example, if the input level is higher than at the start point of AGC, and higher than the threshold of the signal determination unit 20, this function comes into effect. In the case of applying the technology proposed in Japanese Patent Application Laid-Open No. 2000-244353, two stages of gain control circuits are provided to the system for input signals rather than to the signal processing unit 14, but in the present embodiment, the number of the gain control circuits may be only one. Also, control by the signal determination unit 20 is not feedback control, and thus, the influence of bandwidth limitation of the circuit at the later stage than the variable amplifier unit 12 is not felt, and an interference signal may be detected in a wide bandwidth.

Additionally, since the signal determination unit 20 determines the state of each of the signal levels of the desired signal and the interfering signal, it is important that the bandwidth is wider than for the variable amplifier unit 12. That is, it is desired that the frequency band of not only a desired signal component but an interfering signal component can be dealt with. On the other hand, it is enough if the variable amplifier unit 12 can deal with the frequency band of a desired signal component, and the frequency characteristics for the interfering signal component are better reduced.

Since there is no document certifying that FIG. 1 in the proposal is known outside the company, FIG. 1 in the proposal is also included within the scope of the present application.

<Modified Structure 1>

Figure 3:
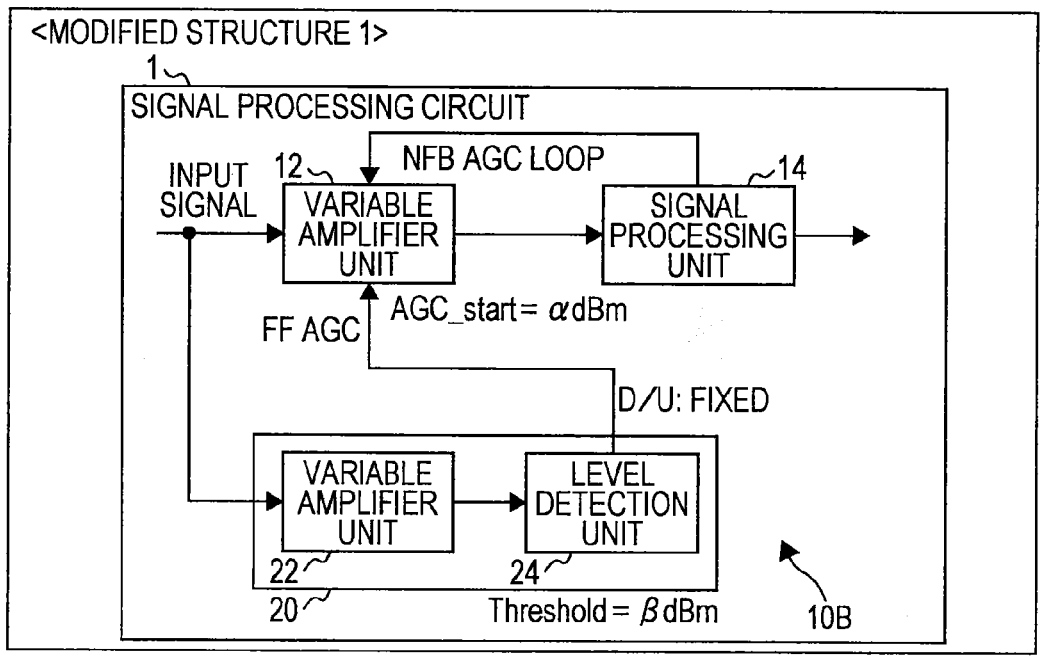
FIG. 3 is a diagram for describing a first modified structure of the gain control circuit of the present embodiment.

FIG. 3 is a diagram for describing a first modified structure of a gain control circuit of the present embodiment. A gain control circuit 10B of the first modified structure is different from the gain control circuit 10A of the basic structure in that a variable amplifier unit 22 and a level detection unit 24 are provided to the signal determination unit 20. Other aspects are the same as the gain control circuit 10A.

The signal determination unit 20 of Modified Structure 1 is characteristic in that, in a case a plurality of types of signals at different frequencies are to be supplied to the variable amplifier unit 12, control is performed such that the variable amplifier unit 12 operates in an appropriate state, based on the state of each of the signal levels of a signal at a desired frequency (a desired signal) and other signals (interfering signals). What is meant by "such that the variable amplifier unit 12 operates in an appropriate state" is that the variable amplifier unit 12 operates in a state where IIP3 is at a required level regardless of the states of the desired signal level and the interfering signal level.

For example, the relationship between the desired signal level, the interfering signal level and IIP3 is as shown in FIG. 1. That is, in a logarithmic expression, the function for a desired signal is expressed by the curve of inclination 1, and the third-order intermodulation distortion is expressed by the curve of inclination 3, or in other words, it is increased in proportion to the cube of the product of two signals. In the case of achieving a required IIP3 level, the level is not determined based on one of the desired signal level and the interfering signal level, and both are involved. Taking this point in account, the variable amplifier unit 12 is made to operate in a state where IIP3 is at a required level. Specifically, the gain control operation of the variable amplifier unit 12 is to be performed in a state where the ratio (D/U) between the desired signal level (D: Desire_Input) and the interfering signal level (U: Undesire_Input) is constant.

According to this function, the variable amplifier unit 12 may be appropriately controlled without being influenced by the level difference between a desired signal and an interfering signal. As a desired signal becomes larger, the gain of the variable amplifier unit 12 is reduced according to the determination output of the signal determination unit 20. In the case of low signal input, the gain of the variable amplifier unit 12 is maximized and the deterioration of NF (noise factor) is prevented, and in contrast, in the case of large input, the gain is restricted to suppress the distortion at the variable amplifier unit 12 and the signal processing unit 14, and the signal transmission device 1 (for example, a receiving circuit) with a wide dynamic range is structured.

In Modified Structure 1, to realize this function, the signal determination unit 20 uses, as the variable amplifier unit 22, a variable gain amplifier that operates with a variable width corresponding to the variable width of the variable amplifier unit 12 on the main signal path. As can be understood from the description of the signal determination unit 20, it is important that the bandwidth of the variable amplifier unit 22 is wider than that of the variable amplifier unit 12. On the other hand, the noise characteristic is not much of a problem and it is enough if level determination can be appropriately performed, and thus, a low noise amplifier does not have to be used. Taking this point into account, the variable amplifier unit 22 is preferably proportionally smaller in size than the variable amplifier unit 12 on the main signal path. Being "proportional in size" has an advantage that other characteristics may be made approximately the same as those of the variable amplifier unit 12.

To "operate with a variable width corresponding to the variable width of the variable amplifier unit 12 on the main signal path", it is enough if the amplification factor of the variable amplifier unit 12, which is an example of the first amplifier, and the amplification factor of the variable amplifier unit 22, which is an example of the second amplifier, are controlled while maintaining a relative relationship, and although, as a typical example, the variable width is the same as that of the variable amplifier unit 12, this is not restrictive, and there may be a certain degree of difference therebetween.

This is because this difference may be cancelled by causing the level detection unit 24 to include an offset function or the like.

An output signal of the variable amplifier unit 22 is supplied to the level detection unit 24. The level detection unit 24 detects the signal level based on the output of the variable amplifier unit 22, and controls the variable amplifier unit 12 on the main signal path. A gain control method capable of enlarging the dynamic range of the variable amplifier unit 12 without wasting S/N may thereby be realized. With the effect of the variable amplifier unit 22 on the replica signal path, gain control may be performed with a fixed difference in the levels of a desired signal and an interfering signal (fixed D/U). The gain control can be performed at an optimal operating point at all times without being influenced by the difference in the levels of an interfering signal and a desired signal at the input of the variable amplifier unit 12 (regardless of the input level), and the variable amplifier unit 12 may be appropriately controlled. The signal transmission device 1 which is desirable in both NF and dynamic range may be structured.

<Modified Structure 2>

Figure 4:
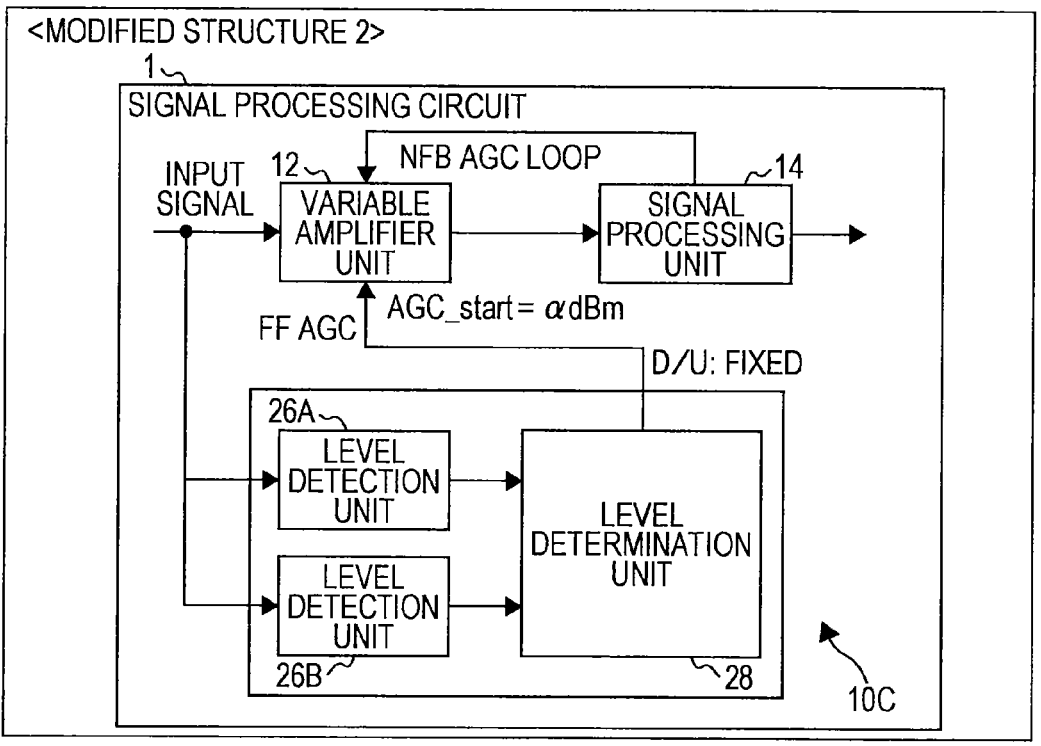
FIG. 4 is a diagram for describing a second modified structure of the gain control circuit of the present embodiment.

FIG. 4 is a diagram for describing a second modified structure of a gain control circuit of the present embodiment. A gain control circuit 10C of the second modified structure is different from the gain control circuit 10A of the basic structure in that a level detection unit 26A and a level detection unit 26B, and a level determination unit 28 are provided to the signal determination unit 20. Other aspects are the same as the gain control circuit 10A.

Like Modified Structure 1, Modified Structure 2 causes the gain control operation of the variable amplifier unit 12 to be performed in a state where the ratio between a desired signal level D and an interfering signal level U (D/U) is fixed. With this function, the variable amplifier unit 12 may be appropriately controlled without being influenced by the difference in the levels of a desired signal and an interfering signal.

With Modified Structure 2, to realize this function, a function unit for detecting the level of a desired signal and a function unit for detecting the level of an interfering signal are separately provided, and the variable amplifier unit 12 is controlled based on the results, in a state where the D/U ratio is fixed. Specifically, the level detection unit 26A is for detecting the level of a desired signal, and for example, a bandpass filter for passing frequency band components of the desired signal is used at the input stage. On the other hand, the level detection unit 26B is for detecting the level of an interfering signal, and for example, a band stop (limit) filter (a band elimination filter, a notch filter) for limiting the frequency band components of the desired signal is used at the input stage. The detection result of the level detection unit 26A and the detection result of the level detection unit 26B are supplied to the level determination unit 28. The level determination unit 28 detects the signal levels based on the detection result of the level detection unit 26A and the detection result of the level detection unit 26B, and controls the variable amplifier unit 12 on the main signal path. A gain control method capable of enlarging the dynamic range of the variable amplifier unit 12 without wasting S/N may thereby be realized. With the effects of the level detection unit 26A, the level detection unit 26B, and the level determination unit 28 on the replica signal path, gain control may be performed with a fixed difference in the levels of a desired signal and an interfering signal (fixed D/U). The gain control may be performed at an optimal operating point at all times without being influenced by the difference in the levels of an interfering signal and a desired signal at the input of the variable amplifier unit 12. The signal transmission device 1 which is desirable in both NF and dynamic range may be structured.

<Concrete Example Application>

Hereinafter, a concrete example application of the gain control circuit 10 described above will be described. In the following, an example of application to an automatic gain control circuit (AGC circuit) used in a receiving circuit for wireless communication will be described. For example, application to an AGC circuit used in a receiving circuit of a communication device, a TV, or Digital Audio Broadcasting (DAB) for performing mobile communication, or the like, where a received signal fluctuates, and where a large signal level may be received in an adjacent channel from another transmission antenna is desirable.

Example 1

Structure

Figure 5:
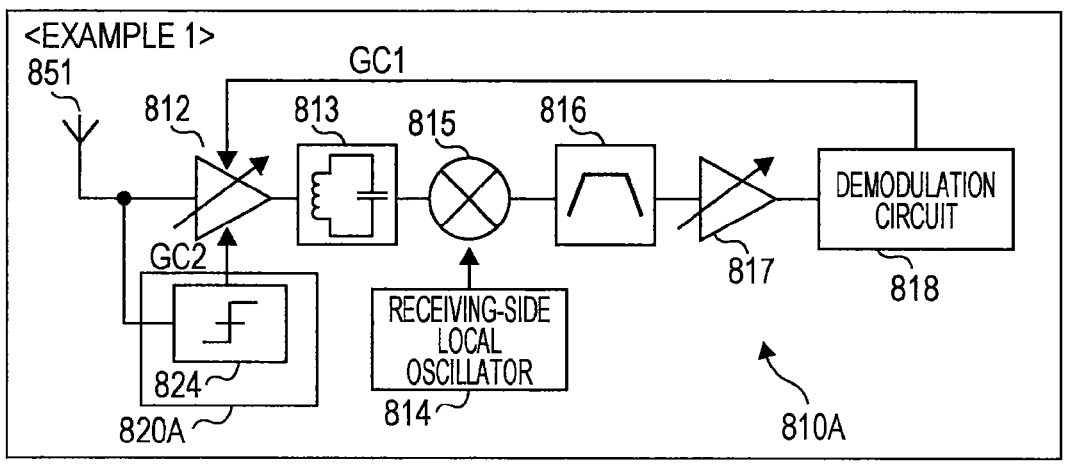
FIG. 5 is a diagram for describing a communication device (including a receiving circuit) of Example 1.

FIG. 5 is a diagram for describing a communication device (including a receiving circuit) of Example 1. A communication device 810A includes an input amplifier unit 812, a receiving-side local oscillator 814 for generating a carrier frequency F_@, a frequency mixing unit 815 (a so-called mixer), a demodulated signal processing unit 816 (for example, a bandpass filter), an output amplifier unit 817, and a demodulation circuit 818, and a receiving antenna 811 is connected to the input amplifier unit 812. The receiving-side local oscillator 814 and the frequency mixing unit 815 form a frequency conversion unit. The input amplifier unit 812 is for gain multiplying the amplitude of a received signal received by the receiving antenna 811, and corresponds to the variable amplifier unit 12 described above. A gain control signal GC1 is supplied from the demodulation circuit 818 to the input amplifier unit 812, and a negative feedback amplifier circuit is structured.

The communication device 810A selects only a desired frequency by imposing bandwidth limitation on received frequencies, and a filter circuit 813 (a tank circuit) is provided for a load on input amplifier unit 812. The filter circuit 813 is an example of a bandwidth limitation unit for limiting the bandwidth of an output signal of the input amplifier unit 812 to the bandwidth of the desired wave. A signal determination unit 820A (corresponding to the signal determination unit 20 describe above) for determining an input signal level of the input amplifier unit 812 is correspondingly provided on a replica signal path different from a main signal path. The signal determination unit 820A includes a level detection unit 824 (corresponding to the level detection unit 24). The level detection unit 824 is provided before the input amplifier unit 812, and the detection result is used as a gain control signal GC2 to control the input amplifier unit 812.

[Gain Control Circuit]

Figure 6:
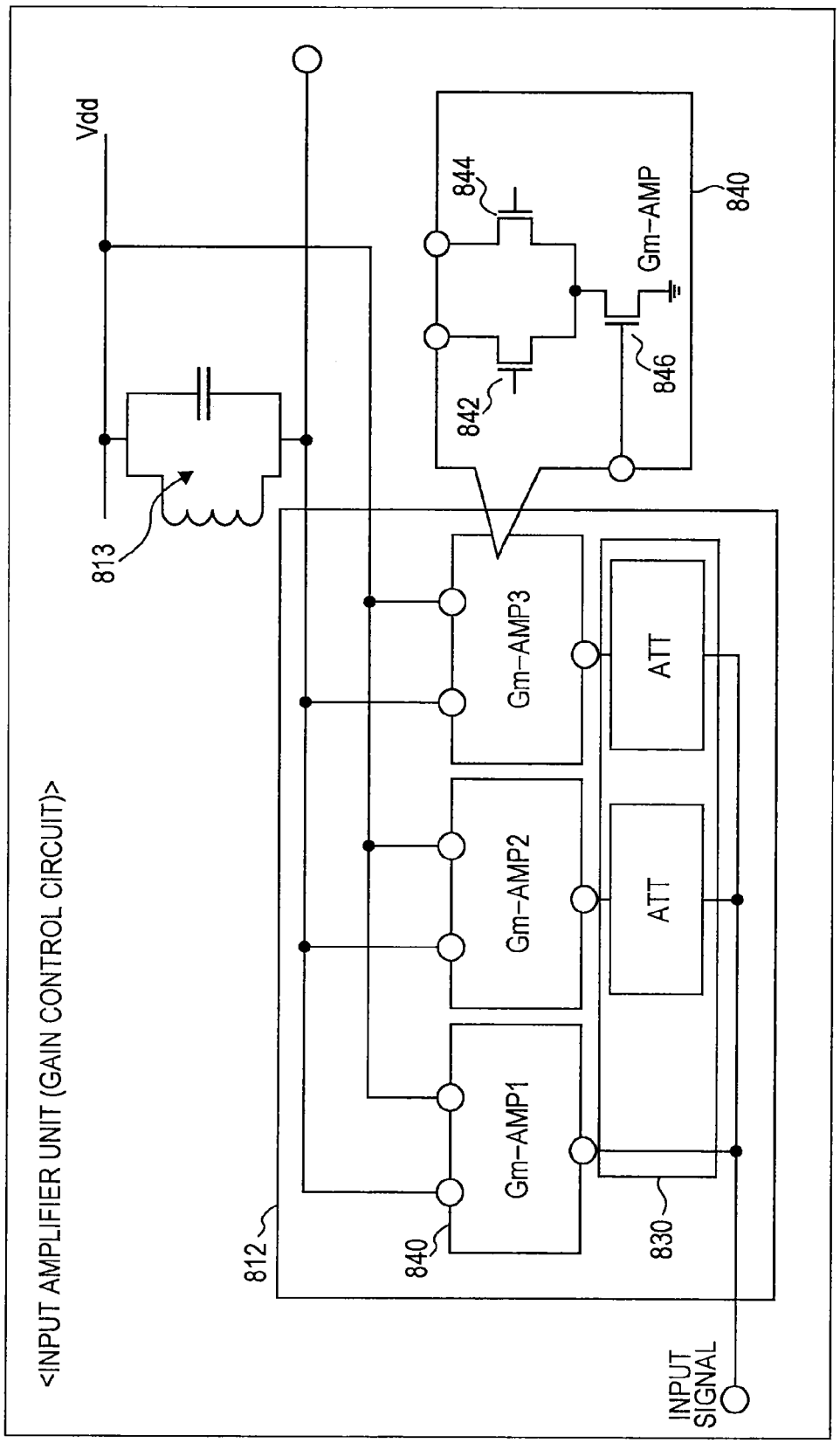
FIG. 6 is a diagram showing an example structure of an input amplifier unit (a gain control circuit).

FIG. 6 is a diagram showing an example structure of the input amplifier unit 812 (the gain control circuit).

An attenuator circuit 830 is provided at an input stage, and a differential amplifier circuit 840 is connected for each tap output. Incidentally, an input end is directly connected to the differential amplifier circuit 840 at the first stage. As the attenuator circuit 830, a resistor ladder circuit may be used, for example. The differential amplifier circuit 840 includes a transistor 842 and a transistor 844, which are a differential pair, and a transistor 846 serving as the current source for the two.

Each of taps of the attenuator circuit 830 is connected to the input end of one of the transistor 842 and the transistor 844, which are the differential pair. The other input ends of the transistor 842 and the transistor 844, which are the differential pair, are connected together, and are further connected to a feedback circuit for determining a gain. This feedback circuit corresponds to one which operates by the gain control signal GC1. The differential pair operates as a current control transconductance (gm) amplifier circuit (Gm-AMP). A control signal (corresponding to the gain control signal GC2) for operating one of the differential pair is supplied to a control input end (a gate) of the transistor 846. An operation state (a gain) at the time of excessively large input is determined depending on which stage's differential pair is to be operated.

Operation of Example 1

Figure 7:
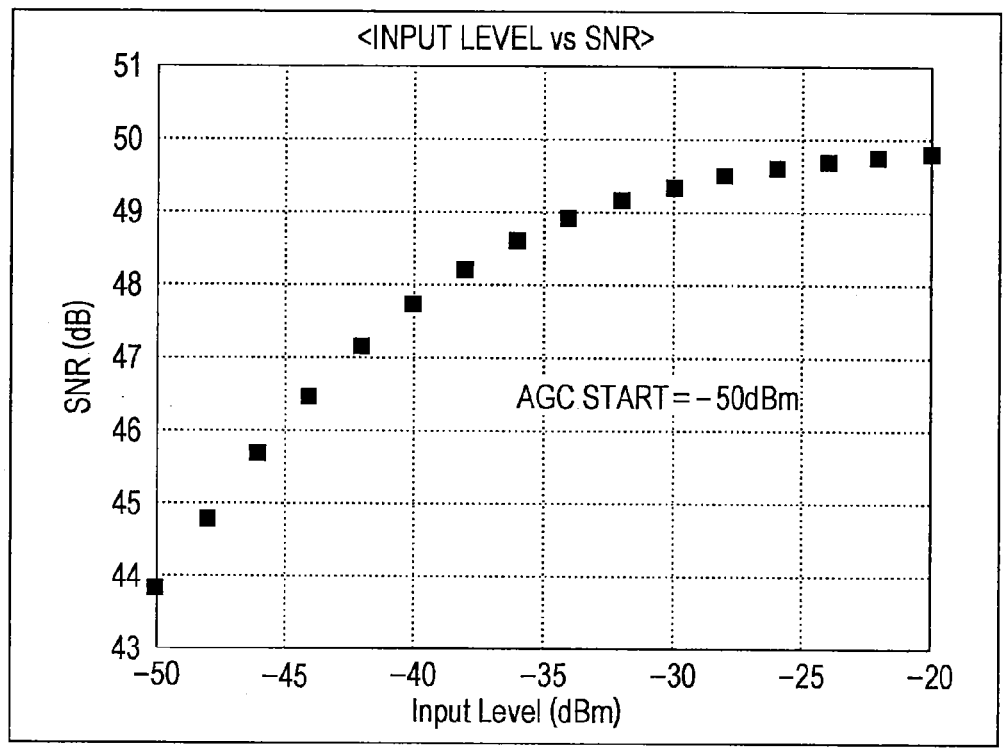
FIG. 7 is a diagram showing a relationship between an input level and an SN ratio (SNR) of a communication device.
Figure 8:
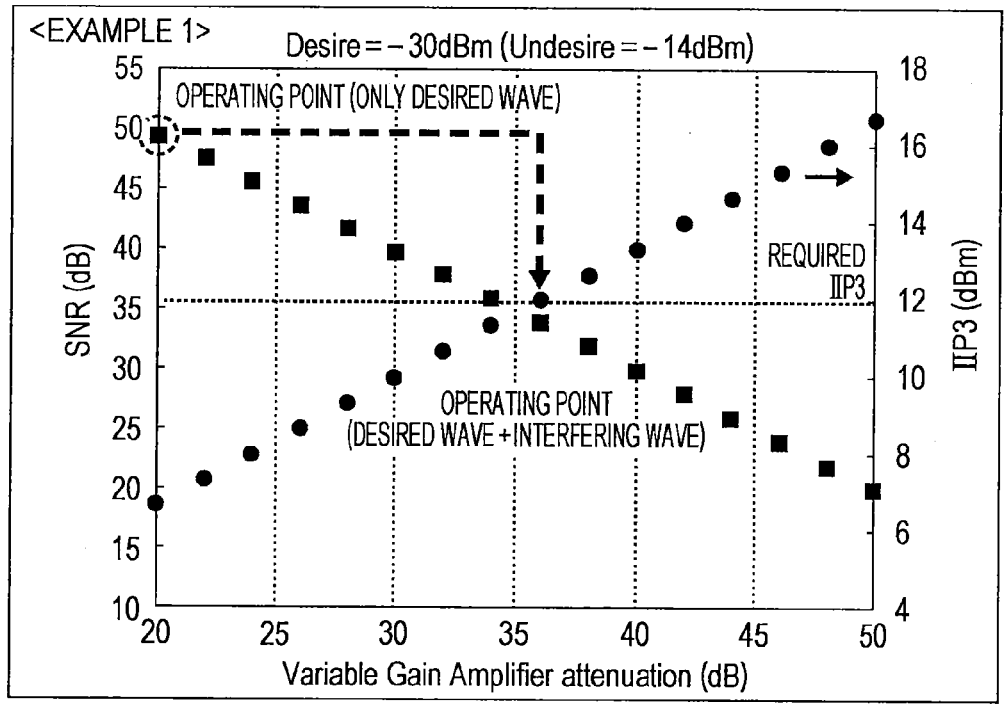
FIG. 8 is a diagram showing a relationship between the amount of attenuation of an input amplifier unit and an SN ratio and IIP3 where a desired wave is at −30 dBm.
Figure 9:
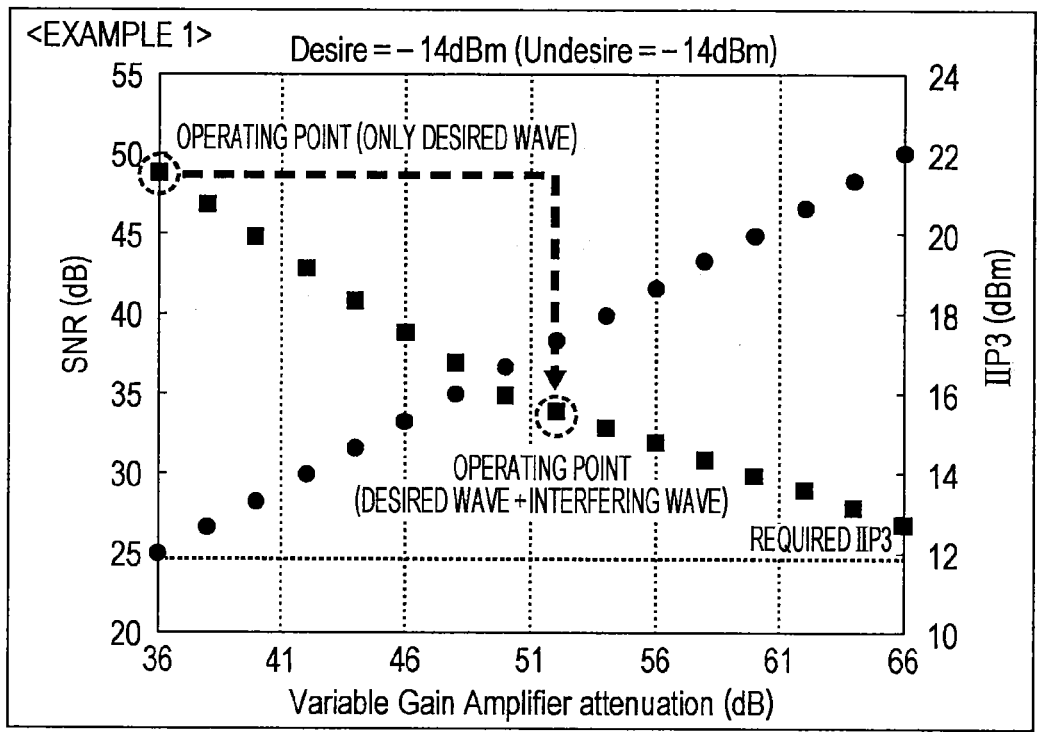
FIG. 9 is a diagram showing a relationship between the amount of attenuation of an input amplifier unit and an SN ratio and IIP3 where a desired wave is at −14 dBm.

FIGS. 7 to 9 are diagrams for describing an operation of the communication device 810A of Example 1. Here, FIG. 7 is a diagram showing a relationship between an input level and an SN ratio (SNR) of the communication device 810A. FIG. 8 is a diagram showing a relationship between the amount of attenuation of the input amplifier unit 812 and an SN ratio and IIP3 where a desired wave is at −30 dBm. FIG. 9 is a diagram showing a relationship between the amount of attenuation of the input amplifier unit 812 and an SN ratio and IIP3 where a desired wave is at −14 dBm.

As shown in FIG. 7, the start point of AGC is at −50 dBm. It can be seen that the noise characteristic is desirable when the input level is high.

FIG. 8 shows operating points where the desired wave is at −30 dBm, and at this time, the threshold of the level detection unit 824 is set at −30 dBm. For example, when assuming the required IIP3 where the signal level of an interfering wave is at −14 dBm to be +12 dBm, it can be seen that reception becomes possible when the input amplifier unit 812 is attenuated by 16 dB.

By restricting the gain at the time of large input, distortion at the input amplifier unit 812 or at a circuit at a later stage can be suppressed. However, there are some drawbacks. For example, FIG. 9 shows operating points where the desired wave is at −14 dBm, and in this case, the required IIP3 is already satisfied by the operating points of the desired wave, but an operation of further deteriorating the S/N is performed. That is, with the communication device 810A of Example 1, the gain is controlled by performing detection at the level of an absolute value of an interfering wave until the desired wave level exceeds the interfering wave level, and there is a drawback that operation at an optimal operating point is not performed for all the receiving levels.

Example 2

Structure

Figure 10:
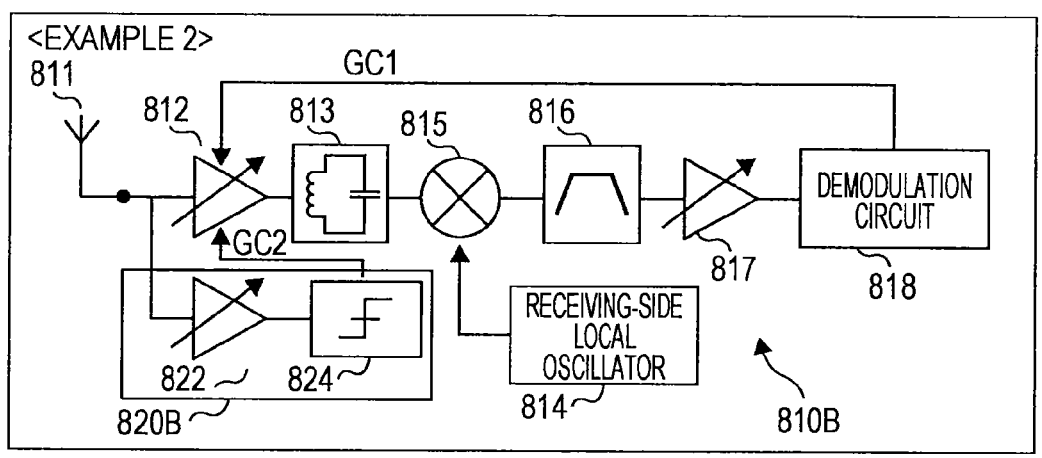
FIG. 10 is a diagram for describing a communication device (including a receiving circuit) of Example 2.

FIG. 10 is a diagram for describing a communication device (including a receiving circuit) of Example 2. A communication device 810B is different from the communication device 810A of Example 1 in the structure of the signal determination unit 820. Specifically, a signal determination unit 820B includes a variable amplifier unit 822 (corresponding to the variable amplifier unit 22), and a level detection unit 824 (corresponding to the level detection unit 24). As the variable amplifier unit 822, a wide bandwidth variable gain amplifier is used so that the interfering wave can also be appropriately processed, but since the noise characteristic does not have to be good, one which is proportionally smaller in size than the variable amplifier unit 812 on the main signal path is used. The signal determination unit 820B is provided before the input amplifier unit 812, and the detection result is used as the gain control signal GC2, and the input amplifier unit 812 is thereby controlled.

The variable amplifier unit 822 has a variable width the same as the input amplifier unit 812 on the main signal path, and also, includes a variable gain amplifier with a wide bandwidth. By including this replica signal path, an interfering wave may be detected over a wide band without being influenced by the bandwidth limitation of the filter circuit 813, and also, due to the effect of the variable amplifier unit 822, gain control may be performed in a state where the difference in the levels of the desired wave and the interfering wave is fixed (fixed D/U).

[Operation of Example 2]

Figure 11:
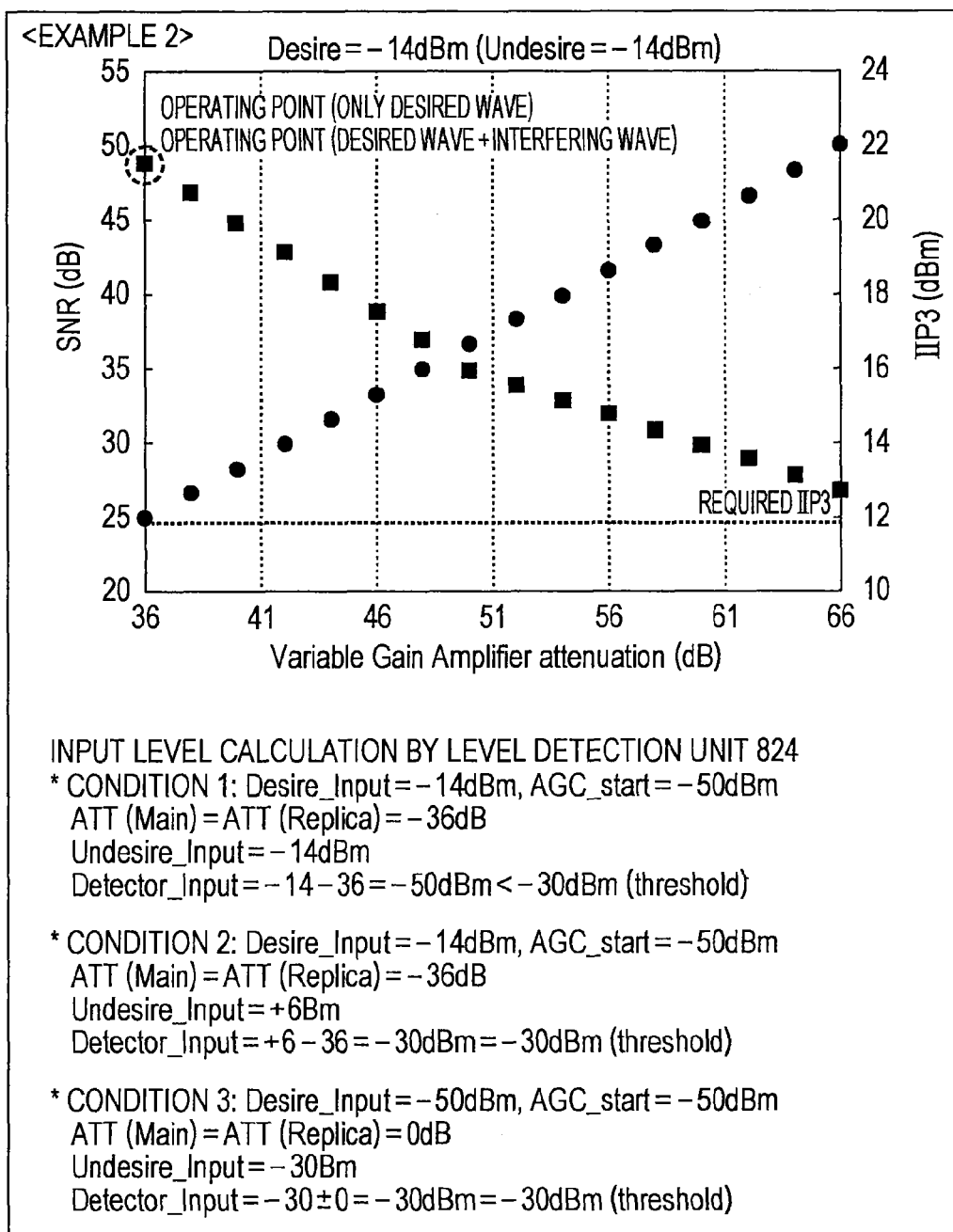
FIG. 11 is a diagram for describing an operation of the communication device of Example 2.

FIG. 11 is diagram for describing an operation of the communication device 810B of Example 2. Here, FIG. 11 corresponds to FIG. 9 for Example 1, and shows a desired wave at −14 dBm, and the amount of attenuation of the input amplifier unit 812, an S/N ratio and IIP3 where the desired wave is at −14 dBm (that is, in a case where D/U=0 dB).

The input level of the communication device 810B and the SN ratio are the same as the characteristics in Example 1 shown in FIG. 7. The threshold of the level detection unit 824 is −30 dBm as in Example 1. When the desired wave is at −30 dBm and the interfering wave is at −14 dBm, the operation as shown in FIG. 8 is performed, as in Example 1.

The level calculation by the level detection unit 824 of the communication device 810B in Example 2 is as shown in FIG. 11. For example, a detection threshold is at −30 dBm, and an AGC start is at −50 dBm, and thus, the gain is controlled with D/U=−20 dB. For example, in FIG. 11, when the desired wave is at −14 dBm and the interfering wave is at −14 dBm, as shown by Condition 1 in the drawing, control by the level detection unit 824 on the input amplifier unit 812 will be an attenuation (ATT) operation of −36 dB (because −14−36=−50). At this time, D/U is 0 dB, and the level of input to the level detection unit 824 is at −50 dBm and is lower than the threshold, and thus, no operation is performed in this case. Accordingly, unnecessary deterioration in S/N is not caused.

On the other hand, as shown by Condition 2 in the drawing, when the desired wave is at −14 dBm and the interfering wave is at +6 dBm, the level of input to the level detection unit 824 is −30 dBm and is at the threshold, and thus, beyond this state (that is, when the interfering wave is at +6 dBm or higher) will be the critical point for the start of AGC operation. It can be seen that the critical point is D/U=−20 dB.

Moreover, as shown by Condition 3 in the drawing, when the desired wave is at −50 dBm and the interfering wave is at −30 dBm, control by the level detection unit 824 on the input amplifier unit 812 will be an attenuation (ATT) operation of ±0 dB (because −50−0=−50). At this time, the level of input to the level detection unit 824 is at −30 dBm and is at the threshold, and beyond this state (that is, when the interfering wave is at −30 dBm or higher) will be the critical point for the start of AGC operation. It can be seen that, also in this case, the critical point is D/U=−20 dB.

According to Example 2, due to the effect of the variable amplifier unit 822, gain control may be performed with the D/U ratio corresponding to the difference between a detection threshold and AGC start being fixed with respect to the difference in the levels of the desired wave and the interfering wave. As described, unlike Example 1 where the gain is controlled by performing detection at the level of an absolute value of an interfering wave, in Example 2, gain control is performed with the D/U being fixed, and gain control may be performed with an optimal operating point at all times regardless of the input level of each of the desired wave and the interfering wave. As described above, by carrying out the present invention of performing gain control with fixed D/U, gain control can be performed with an optimal operating point at all times regardless of the input level.

Example 3

FIG. 12 is a diagram for describing Example 3. Here, (A) of FIG. 12 shows an arrangement image of a plurality of communication devices within an electronic appliance, (B) of FIG. 12 shows an example detailed structure of the communication devices, and (C) of FIG. 12 shows an example of frequency arrangement of carrier frequencies.

Example 3 is an example application where a plurality of communication devices are arranged inside the housing of one electronic appliance and communication is performed. For example, this is a mode where all the communication devices (communication chips) are mounted on the same board in one electronic appliance, and each carrier carrier frequency is set in advance. A case is assumed where more than three sets regarding transmission/reception are randomly arranged on the circuit board inside the electronic appliance with no respect to the arrangement, the directivity of the radio wave or the like.

For example, in FIG. 12, a case where 3-band frequency arrangement is applied is shown. As shown in (A) of FIG. 12, a signal transmission device 1A is housed on a circuit board 701 inside an electronic appliance 751, the signal transmission device 1A including three sets regarding transmission/reception, namely, a set of a communication device 710_1 having a function of a transmitter and a communication device 810_1 having a function of a receiver, a set of a communication device 710_2 having a function of a transmitter and a communication device 810_2 having a function of a receiver, and a set of a communication device 710_3 having a function of a transmitter and a communication device 810_3 having a function of a receiver.

As shown in (B) in FIG. 12, each of the communication device 710_1, the communication device 710_2 and the communication device 710_3 includes a modulation target signal processing unit 712, a signal amplifier unit 713, a transmission-side local oscillator 714 for generating a carrier frequency $F\_n$ (where n is any of 1, 2 and 3) as a local frequency, a frequency mixing unit 715 (a so-called mixer), and an output amplifier unit 717, and a transmission antenna 718 is connected to the output amplifier unit 717. The transmission-side local oscillator 714 and the frequency mixing unit 715 form a modulation unit. The modulation target signal processing unit 712 includes a low pass filter, for example, and restricts the reception bandwidth of a modulation signal. The signal amplifier unit 713 gain multiplies the amplitude of a signal output from the modulation target signal processing unit 712. The frequency mixing unit 715 performs a modulation process by multiplying a signal output from the signal amplifier unit 713 and a carrier signal (a carrier frequency $F\_n$) from the transmission-side local oscillator 714. The output amplifier unit 717 gain multiplies the amplitude of a signal modulated by the frequency mixing unit 715.

As shown in (B) in FIG. 12, each of the communication device 810_1, the communication device 810_2 and the communication device 810_3 includes an input amplifier unit 812, a receiving-side local oscillator 814 for generating a carrier frequency $F\_n$, a frequency mixing unit 815 (a so-called mixer), a demodulated signal processing unit 816 (for example, a low pass filter), and an output amplifier unit 817, and a receiving antenna 811 is connected to the input amplifier unit 812. The receiving-side local oscillator 814 and the frequency mixing unit 815 form a demodulation unit. The input amplifier unit 812 gain multiplies the amplitude of a received signal received by the receiving antenna 811. The frequency mixing unit 815 performs a demodulation process by multiplying a received signal output from the input amplifier unit 812 and a carrier signal (a carrier frequency $F\_n$) from the receiving-side local oscillator 814. The demodulated signal processing unit 816 includes a low pass filter, for example, and restricts the reception bandwidth of a demodulated signal. The output amplifier unit 817 gain multiplies the amplitude of a demodulated signal output from the demodulated signal processing unit 816.

As shown in (B) in FIG. 12, a modulation signal S711 in a whole reception bandwidth Bw1 is input to the communication device 710_1, and is modulated by the transmission-side local oscillator 714 at a carrier frequency $F\_1$, and a radio wave is transmitted from the transmission antenna 718. The receiving antenna 811 receives this modulated signal and inputs the same to the communication device 810_1, and demodulation is performed at the demodulation unit, and a demodulated signal S811 is output from the output amplifier unit 817.

As shown in (B) in FIG. 12, a modulation signal S721 in a whole reception bandwidth Bw2 is input to the communication device 710_2, and is modulated by the transmission-side local oscillator 714 at a carrier frequency $F\_2$, and a radio wave is transmitted from the transmission antenna 718. The receiving antenna 811 receives this modulated signal and inputs the same to the communication device 8102, and demodulation is performed at the demodulation unit, and a demodulated signal S821 is output from the output amplifier unit 817.

As shown in (B) in FIG. 12, a modulation signal S731 in a whole reception bandwidth Bw3 is input to the communication device 710_3, and is modulated by the transmission-side local oscillator 714 at a carrier frequency $F\_3$, and a radio wave is transmitted from the transmission antenna 718. The receiving antenna 811 receives this modulated signal and inputs the same to the communication device 810_3, and demodulation is performed at the demodulation unit, and a demodulated signal S831 is output from the output amplifier unit 817.

Here, as shown in (C) in FIG. 12, as the frequency arrangement of the carrier frequency $F\_1$, the carrier frequency $F\_2$ and the carrier frequency $F\_3$, the carrier frequency $F\_1$ and the carrier frequency $F\_2$ are arranged with a frequency difference D12 therebetween, and the carrier frequency $F\_2$ and the carrier frequency $F\_3$ are arranged with a frequency difference D23 (=D12) therebetween. The band gap between the modulated signal based on the carrier frequency $F\_1$ and the modulated signal based on the carrier frequency $F\_2$ is H12, and the band gap between the modulated signal based on the carrier frequency $F\_2$ and the modulated signal based on the carrier frequency $F\_3$ is H23 (=H12).

In the case of such a frequency arrangement, the frequency use efficiency is high, but cross modulation may become a problem. For example, if signals at two carrier frequencies not related to a desired wave (self station) are received and input to a non-linear amplifier circuit or frequency mixer circuit, a signal of a difference between the two carrier frequencies (an interfering wave component) is also output. In the case of the frequency arrangement shown in (C) in FIG. 12, the difference between the two carrier frequencies is present near the frequency of the desired wave, and there is the problem of "intermodulation distortion" where the interfering wave component is also demodulated. Typically, when signals at a plurality of frequencies adjacent to the receiving band of the self station are received, if the linear performance of the amplifier circuit or the frequency mixer circuit is poor, third-order distortion occurs in the receiving band (normally, only the first-order component of a modulated signal has to be taken into account), and the reception quality is significantly reduced.

In such a case, by applying the present embodiment (the basic structure, or Modified Structure 1 or Modified Structure 2, or Example 1 or Example 2), Heretofore, embodiments have been described with respect to the technology disclosed in the present specification, but the technical scope described in the claims is not limited to the embodiments described above. Various alterations or modifications may be made to the embodiments described above without departing from the gist of the technology disclosed in the present specification, and modes where such alterations or modifications are made are included in the technical scope of the technology disclosed in the present specification. The embodiments described above do not limit the technology according to the claims, and not all of the combinations of the features described in the embodiments are indispensable for solving the problems which are the targets of the technology disclosed in the present specification. The embodiments described above include technologies for various stages, and various technologies may be extracted by appropriately combining a plurality of structural elements that are disclosed. If effects for the problems that are the targets of the technology disclosed in the present specification may be achieved even if some structural elements are eliminated from the entire structural elements shown in the embodiments, structures where the structural elements are eliminated may also be extracted as the technologies disclosed in the present specification.

Based on the description of the embodiments above, the following technologies, for example, may be extracted in addition to the technologies according to the claims described in the scope of claims. They are listed as follows.

[Supplemental Note 1]
A gain control circuit including:
a first amplifier for amplifying an input signal; and
a signal determination unit for determining the input signal to be input to the first amplifier, and controlling an amplification factor of the first amplifier based on a determination result.

[Supplemental Note 2]
The gain control circuit according to Supplemental Note 1,
in which the input signal includes a desired wave and an interfering wave, and
in which the signal determination unit determines each of levels of the desired wave and the interfering wave.

[Supplemental Note 3]
The gain control circuit according to Supplemental Note 2,
in which the signal determination unit determines, while not distinguishing between, the level of the desired wave and the level of the interfering wave.

[Supplemental Note 4]
The gain control circuit according to Supplemental Note 3,
in which the signal determination unit includes
a second amplifier for amplifying the input signal input to the first amplifier, and
a level detection unit for detecting a level of an output signal of the second amplifier, and
in which the amplification factor of the first amplifier and an amplification factor of the second amplifier are controlled with a relative relationship.

[Supplemental Note 5]
The gain control circuit according to Supplemental Note 4,
in which the amplification factor of the first amplifier and the amplification factor of the second amplifier are controlled to be same.

[Supplemental Note 6]
The gain control circuit according to Supplemental Note 4 or 5, in which the second amplifier is proportionally smaller in size than the first amplifier.

[Supplemental Note 7]
The gain control circuit according to Supplemental Note 2,
in which the signal determination unit includes
a first level detection unit for detecting the level of the desired wave,
a second level detection unit for detecting the level of the interfering wave, and
a level determination unit for controlling the amplification factor of the first amplifier based on detection results of the first level detection unit and the second detection unit.

[Supplemental Note 8]
The gain control circuit according to any one of Supplemental Notes 4 to 7, in which the amplification factor of the first amplifier is controlled with a fixed difference in the levels of the desired wave and the interfering wave.

[Supplemental Note 9]
The gain control circuit according to any one of Supplemental Notes 1 to 8, in which a bandwidth limitation unit is provided for an output of the first amplifier, for limiting a bandwidth of an output signal to a bandwidth of the desired wave.

[Supplemental Note 10]
The gain control circuit according to any one of Supplemental Notes 1 to 9, in which a control loop is provided at a following stage of the first amplifier, for detecting a level of a signal corresponding to a level of an output signal of the first amplifier and controlling the amplification factor of the first amplifier.

[Supplemental Note 11]
A communication device including:
a first amplifier for amplifying a received signal;
a receiving unit for performing a receiving process based on a signal output from the first amplifier; and
a signal determination unit for determining the received signal to be input to the first amplifier, and controlling an amplification factor of the first amplifier based on a determination result.

[Supplemental Note 12]
An electronic appliance including:
a first amplifier for amplifying an input signal;
a signal processing unit for performing signal processing based on a signal output from the first amplifier; and
a signal determination unit for determining the input signal to be input to the first amplifier, and controlling an amplification factor of the first amplifier based on a determination result.

[Supplemental Note 13]
An electronic appliance including:
a first amplifier for amplifying a received signal;
a receiving unit for performing a receiving process based on a signal output from the first amplifier; and
a signal determination unit for determining the received signal to be input to the first amplifier, and controlling an amplification factor of the first amplifier based on a determination result.

[Supplemental Note 14]

The electronic appliance according to Supplemental Note 13, including:

a plurality of communication units including the first amplifier, the receiving unit, and the signal determination unit.

[Supplemental Note 15]

A gain control method including:

determining an input signal to be input to a first amplifier for amplifying the input signal, and controlling an amplification factor of the first amplifier by a feed forward system based on a determination result.

[Supplemental Note 16]

The gain control method according to Supplemental Note 15, in which the input signal includes a desired wave and an interfering wave, and in which the amplification factor of the first amplifier is controlled with a fixed difference in levels of the desired wave and the interfering wave.

REFERENCE SIGNS LIST

1 Signal processing circuit
10 Gain control circuit
12 Variable amplifier unit
14 Signal processing unit
20 Signal determination unit
22 Variable amplifier unit
24 Level detection unit
26A Level detection unit
26B Level detection unit
28 Level determination unit

The invention claimed is:

1. A gain control circuit comprising:
a first amplifier for amplifying an input signal; and
a signal determination unit for determining the input signal to be input to the first amplifier, and controlling an amplification factor of the first amplifier based on a determination result,
wherein a control loop is provided at a following stage of the first amplifier, for detecting a level of an output signal of the first amplifier and controlling the amplification factor of the first amplifier based on the detected level of the output signal.

2. The gain control circuit according to claim 1,
wherein the input signal includes a desired wave and an interfering wave, and
wherein the signal determination unit determines each of levels of the desired wave and the interfering wave.

3. The gain control circuit according to claim 2, wherein the signal determination unit determines, while not distinguishing between, the level of the desired wave and the level of the interfering wave.

4. The gain control circuit according to claim 3,
wherein the signal determination unit includes
a second amplifier for amplifying the input signal input to the first amplifier, and
a level detection unit for detecting a level of an output signal of the second amplifier, and
wherein the amplification factor of the first amplifier and an amplification factor of the second amplifier are controlled with a relative relationship.

5. The gain control circuit according to claim 4, wherein the amplification factor of the first amplifier is controlled with a fixed difference in the levels of the desired wave and the interfering wave.

6. The gain control circuit according to claim 5, wherein the amplification factor of the first amplifier and the amplification factor of the second amplifier are controlled to be same.

7. The gain control circuit according to claim 6, wherein the second amplifier is proportionally smaller in size than the first amplifier.

8. The gain control circuit according to claim 2,
wherein the signal determination unit includes
a first level detection unit for detecting the level of the desired wave,
a second level detection unit for detecting the level of the interfering wave, and
a level determination unit for controlling the amplification factor of the first amplifier based on detection results of the first level detection unit and the second level detection unit.

9. The gain control circuit according to claim 8, wherein the amplification factor of the first amplifier is controlled with a fixed difference in the levels of the desired wave and the interfering wave.

10. The gain control circuit according to claim 1, wherein a bandwidth limitation unit is provided for an output of the first amplifier, for limiting a bandwidth of the output signal of the first amplifier to a bandwidth of a desired wave in the input signal.

11. A communication device comprising:
a first amplifier for amplifying a received signal;
a receiving unit for performing a receiving process based on a signal output from the first amplifier; and
a signal determination unit for determining the received signal to be input to the first amplifier, and controlling an amplification factor of the first amplifier based on a determination result,
wherein the signal determination unit includes
a second amplifier for amplifying the received signal input to the first amplifier, and
a level detection unit for detecting a level of an output signal of the second amplifier, and
wherein the amplification factor of the first amplifier and an amplification factor of the second amplifier are controlled with a relative relationship.

12. An electronic appliance comprising:
a first amplifier for amplifying an input signal;
a signal processing unit for performing signal processing based on a signal output from the first amplifier; and
a signal determination unit for determining the input signal to be input to the first amplifier, and controlling an amplification factor of the first amplifier based on a determination result,
wherein the input signal includes a desired wave and an interfering wave, and
wherein the amplification factor of the first amplifier is controlled with a fixed difference in levels of the desired wave and the interfering wave.

13. An electronic appliance comprising:
a first amplifier for amplifying a received signal;
a receiving unit for performing a receiving process based on a signal output from the first amplifier; and
a signal determination unit for determining the received signal to be input to the first amplifier, and controlling an amplification factor of the first amplifier based on a determination result,
wherein the input signal includes a desired wave and an interfering wave, and wherein the amplification factor of the first amplifier is controlled with a fixed difference in levels of the desired wave and the interfering wave.

14. The electronic appliance according to claim 13, comprising:
a plurality of communication units including the first amplifier, the receiving unit, and the signal determination unit.

15. A gain control method comprising:
determining an input signal to be input to a first amplifier for amplifying the input signal, and controlling an amplification factor of the first amplifier by a feed forward system based on a determination result,
wherein the input signal includes a desired wave and an interfering wave, and
wherein the amplification factor of the first amplifier is controlled with a fixed difference in levels of the desired wave and the interfering wave.

16. The gain control circuit according to claim 1,
wherein the input signal includes a desired wave and an interfering wave, and
wherein the controlling of the amplification factor of the first amplifier by the signal determination unit is based on
the absolute value of a level of the desired wave, when the level of the desired wave is greater than a level of the interfering wave, and
the absolute value of the level of the interfering wave, when the level of the interfering wave is greater than the level of the desired wave.

* * * * *